(12) United States Patent
Coffy et al.

(10) Patent No.: US 11,380,663 B2
(45) Date of Patent: Jul. 5, 2022

(54) ELECTRONIC DEVICE COMPRISING OPTICAL ELECTRONIC COMPONENTS AND MANUFACTURING METHOD

(71) Applicant: STMicroelectronics (Grenoble 2) SAS, Grenoble (FR)

(72) Inventors: Romain Coffy, Voiron (FR); Remi Brechignac, Grenoble (FR); Jean-Michel Riviere, Froges (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 11 days.

(21) Appl. No.: 17/006,092

(22) Filed: Aug. 28, 2020

(65) Prior Publication Data
US 2021/0066271 A1    Mar. 4, 2021

(30) Foreign Application Priority Data
Sep. 3, 2019   (FR) ...................................... 1909671

(51) Int. Cl.
*H01L 25/16*        (2006.01)
*H01L 31/02*        (2006.01)
(Continued)

(52) U.S. Cl.
CPC ........ *H01L 25/167* (2013.01); *H01L 31/0203* (2013.01); *H01L 31/02016* (2013.01); *H01L 33/52* (2013.01); *H01L 33/62* (2013.01)

(58) Field of Classification Search
CPC ............. H01L 25/167; H01L 31/02016; H01L 31/0203; H01L 33/52; H01L 33/62; H01L 2224/32225; H01L 2224/48091; H01L 2224/48227; H01L 2224/73265; H01L 2224/97; H01L 2924/181; H01L 31/167;
(Continued)

(56) References Cited

U.S. PATENT DOCUMENTS 8,362,496 B1 *   1/2013  Tu ....................... H01L 23/3107
                                                                   257/82
10,734,540 B1 *   8/2020  Chen ....................... H01L 33/52
(Continued)

FOREIGN PATENT DOCUMENTS

CN         105206627 A    12/2015
EP         3067927  A1    9/2016
FR         2977715  A1    1/2013

OTHER PUBLICATIONS

INPI Search Report and Written Opinion for FR 1909671 dated May 8, 2020 (10 pages).

*Primary Examiner* — Victor A Mandala
(74) *Attorney, Agent, or Firm* — Crowe & Dunlevy

(57) ABSTRACT

An opaque dielectric carrier and confinement substrate is formed by a stack of layers laminated on each other. The stack includes a solid back layer and a front frame having a peripheral wall and an intermediate partition which delimits two cavities located on top of the solid back layer and on either side of the intermediate partition. Electronic integrated circuit (IC) chips are located inside the cavities and mounted on top of the solid back layer. Each IC chip includes an integrated optical element. Electrical connections are provided between the IC chips and back electrical contacts of the solid back layer. Transparent encapsulation blocks are molded in the cavities to embed the IC chips.

39 Claims, 5 Drawing Sheets

(51) Int. Cl.
*H01L 31/0203* (2014.01)
*H01L 33/52* (2010.01)
*H01L 33/62* (2010.01)

(58) Field of Classification Search
CPC . H01L 33/486; H01L 25/165; H01L 23/3114; H01L 23/3121; H01L 23/49
See application file for complete search history.

(56) References Cited

U.S. PATENT DOCUMENTS

| | | | |
|---|---|---|---|
| 2004/0208210 A1* | 10/2004 | Inoguchi | G02B 6/0073 |
| | | | 257/E33.072 |
| 2013/0075764 A1 | 3/2013 | Yu | |
| 2014/0021491 A1 | 1/2014 | Meng et al. | |
| 2014/0175462 A1* | 6/2014 | Lermer | H01L 31/167 |
| | | | 257/82 |
| 2015/0060905 A1 | 3/2015 | Nam et al. | |
| 2015/0279826 A1 | 10/2015 | Tu et al. | |
| 2015/0279827 A1 | 10/2015 | Tu et al. | |
| 2016/0041029 A1 | 2/2016 | T'Ng et al. | |
| 2017/0052277 A1 | 2/2017 | Wong et al. | |
| 2018/0190629 A1 | 7/2018 | Hsu et al. | |
| 2019/0195685 A1 | 6/2019 | Herard et al. | |
| 2019/0207051 A1* | 7/2019 | Utsumi | H01L 31/02005 |
| 2021/0066554 A1* | 3/2021 | Coffy | H01L 33/62 |

\* cited by examiner

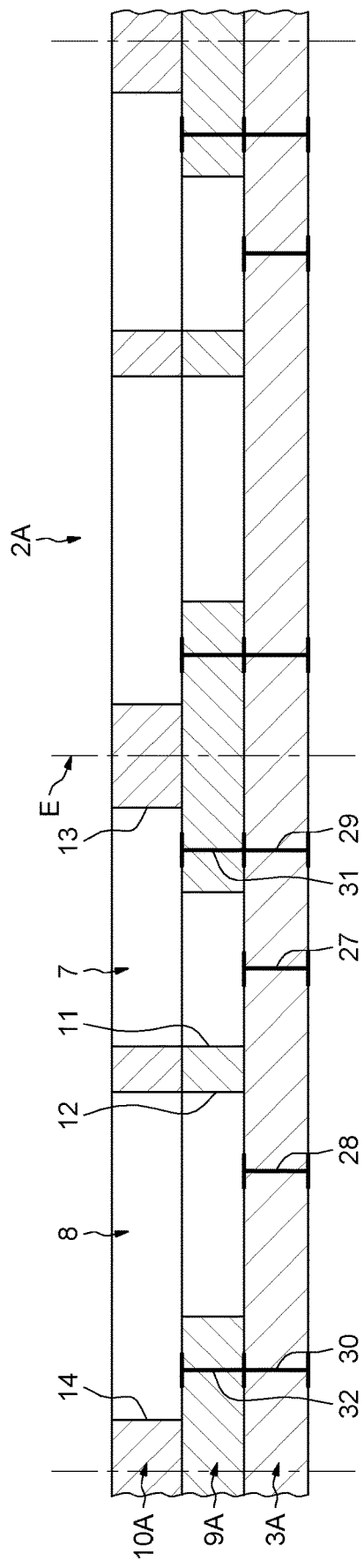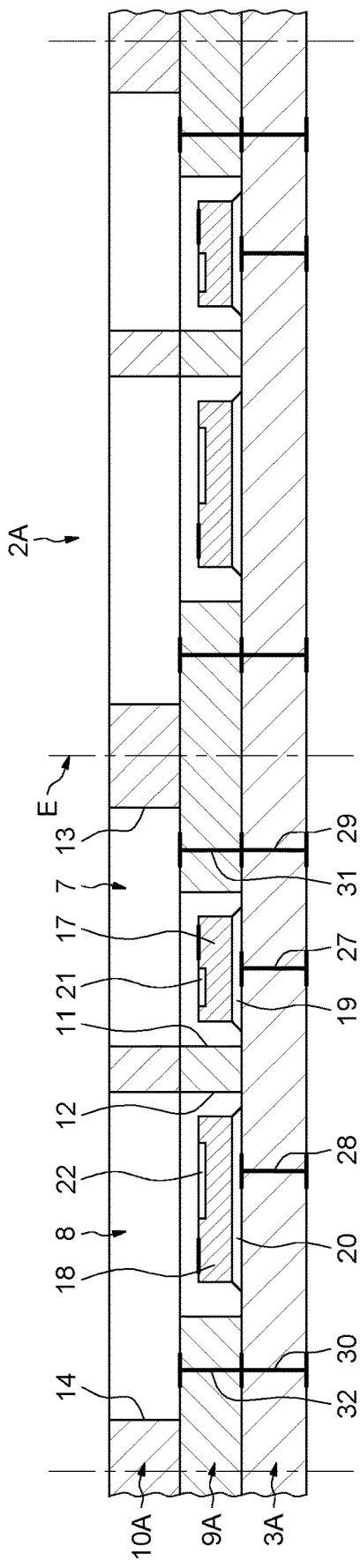

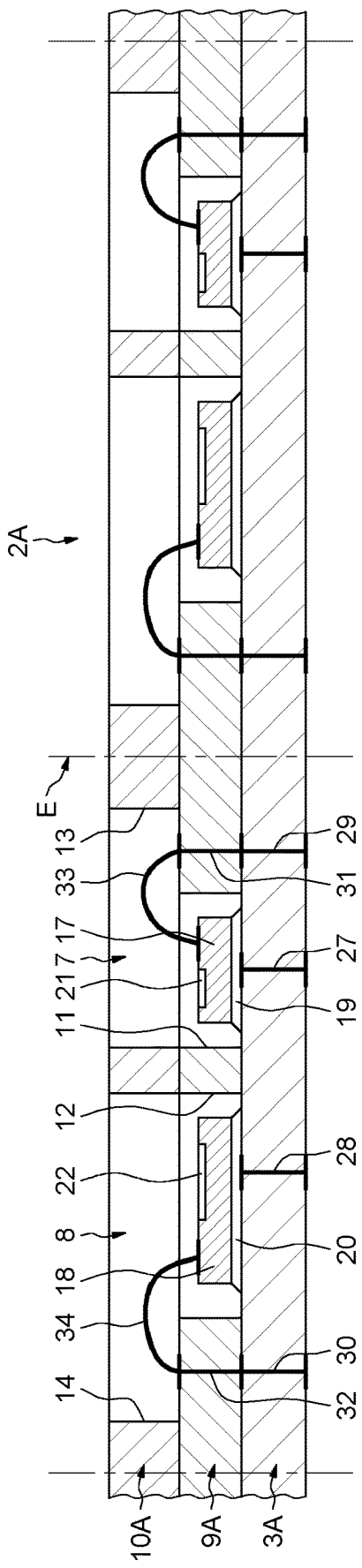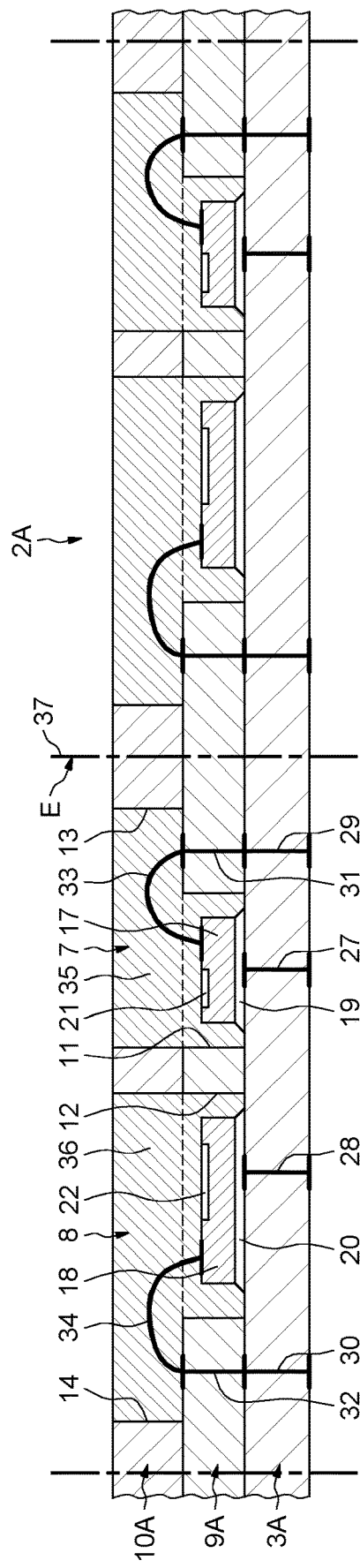

ELECTRONIC DEVICE COMPRISING OPTICAL ELECTRONIC COMPONENTS AND MANUFACTURING METHOD

PRIORITY CLAIM

This application claims the priority benefit of French Application for Patent No. 1909671, filed on Sep. 3, 2019, the content of which is hereby incorporated by reference in its entirety to the maximum extent allowable by law.

TECHNICAL FIELD

The present invention relates to the field of microelectronics and, more specifically, to the field of electronic devices comprising electronic IC chips that include light-emitting and/or light-receiving integrated optical elements.

BACKGROUND

Known electronic devices comprise a carrier substrate including a network of electrical connections, a light-emitting electronic integrated circuit (IC) chip and a light-receiving electronic IC chip, said IC chips being mounted, with a spacing, on top of one face of the carrier substrate, and an encapsulation cover, which is mounted on said face of the carrier substrate and which delimits chambers in which the electronic IC chips are respectively located, this encapsulation cover having openings facing the optical elements of the electronic IC chips, in which optical elements light filters are generally provided.

Electronic devices of this kind require a large number of manufacturing and mounting operations.

SUMMARY

According to one embodiment, what is proposed is an electronic device which comprises: an opaque dielectric carrier and confinement substrate, which comprises several layers laminated on top of one another, including a solid back layer and a front frame which comprises a peripheral wall and an intermediate partition so as to delimit, on either side of this intermediate partition and on top of the solid back layer, two cavities; electronic integrated circuit (IC) chips, which are respectively located inside the cavities and mounted on top of the solid back layer, these IC chips including integrated optical elements; electrical connections between the IC chips and back electrical contacts of the solid back layer; and transparent encapsulation blocks, which are molded in the cavities and in which the IC chips are embedded.

The above arrangements are particularly suitable, especially in the case in which the IC chips are thin, since the carrier and confinement substrate can also be thin, resulting in a thin device.

The electrical connections may comprise electrical contacts in the cavities.

The electrical connections may comprise electrical connection vias passing through the back layer.

The electrical connections may comprise electrical contacts on top of the back layer.

The front frame may comprise at least one layer which is on top of the back layer and provided with openings forming the cavities.

The front frame may comprise a first layer on top of the back layer and a second layer on top of the first layer, the first layer having portions that protrude into the cavities relative to the second layer.

The electrical connections may comprise electrical contacts arranged on top of the portions protruding from the second layer.

The electrical connections may comprise electrical contacts arranged on top of the portions protruding from the second layer.

The electrical connections may comprise electrical connection vias passing through the portions protruding from the second layer.

The encapsulation blocks may include light-filtering particles.

The device may comprise light-filtering optical dies on top of the encapsulation blocks and facing the IC chip optical elements, and an opaque front layer which is on top of the frame and the encapsulation blocks and provided with openings at the locations of the optical dies.

The optical element of one of the electronic IC chips may be a light emitter, and the optical element of the other electronic IC chip may be a light receiver.

BRIEF DESCRIPTION OF THE DRAWINGS

Electronic devices will now be described by way of non-limiting exemplary embodiments illustrated by the appended drawing, in which.

DETAILED DESCRIPTION

Figure 1:
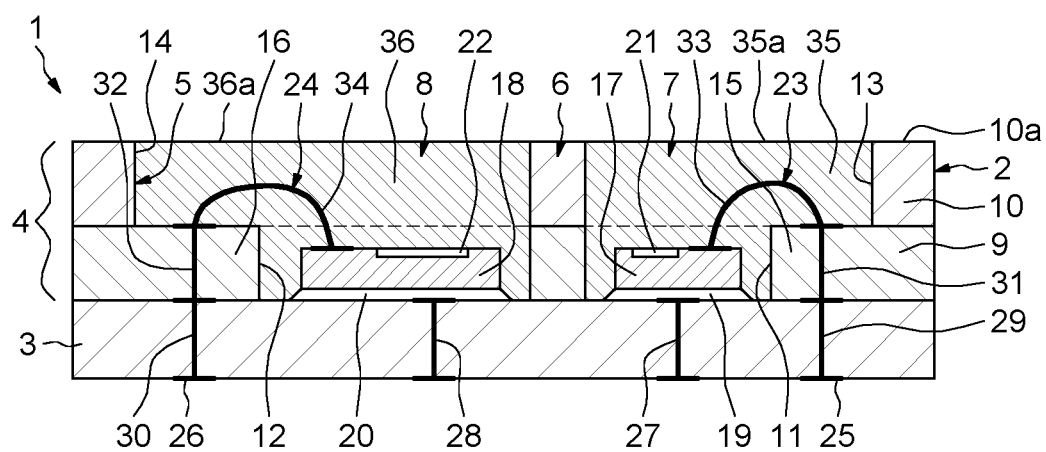
FIG. 1 shows a cross section of an electronic device including optical electronic IC chips.

An electronic device 1 illustrated in FIG. 1 comprises a carrier and confinement substrate 2 which comprises several layers stacked and laminated on top of one another.

The carrier and confinement substrate 2 comprises a stack of layers including a solid back layer 3 and a front frame 4 which comprises a peripheral wall 5 and an intermediate partition 6 which joins two opposite limbs of the peripheral wall 5 so as to delimit, on either side of the intermediate partition 6 and on top of the solid back layer 3, two cavities 7 and 8.

The carrier and confinement substrate 2 is made of an opaque dielectric material, for example an epoxy resin.

The solid back layer 3 and the front frame 4 have, for example, square or rectangular contours which coincide. The front frame 4 has opposite longitudinal limbs and opposite transverse limbs, the intermediate partition 6 joining the longitudinal limbs.

More specifically, the front frame 4 comprises a first layer 9 on top of (and in contact with) the solid back layer 3 and a second layer 10 on top of (and in contact with) the first layer 9. The first layer 9 and the second layer 10 have contours which coincide.

The first layer 9 has openings 11 and 12 and the second layer has openings 13 and 14. The openings 11 and 12 and the openings 13 and 14, which are respectively located on top of one another, form the cavities 7 and 8.

The first layer 9 has portions 15 and 16 that protrude into the cavities 7 and 8 relative to the second layer 10, forming steps.

Figure 2:
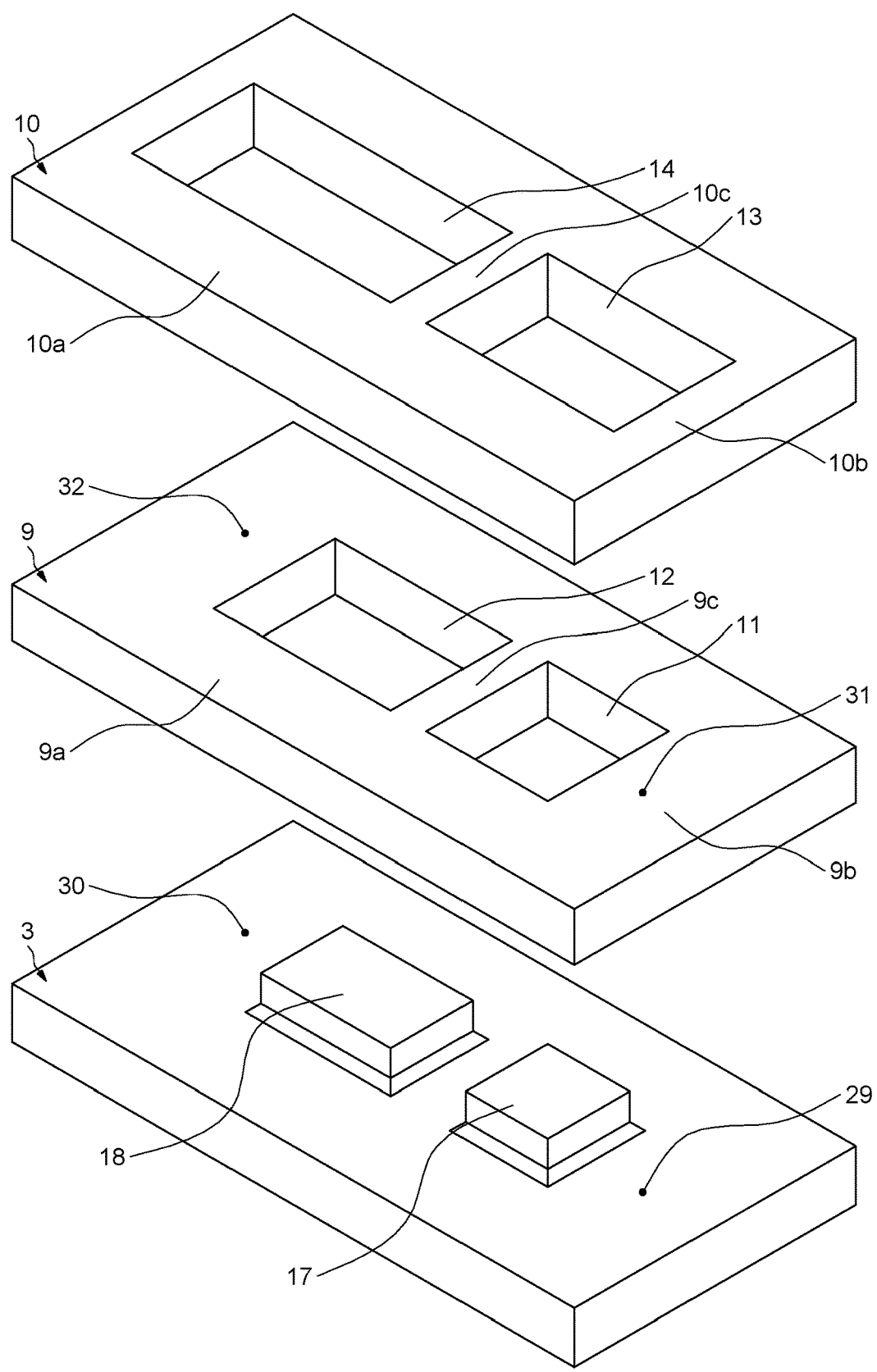
FIG. 2 shows an exploded perspective view of the layers of a carrier and confinement substrate of the electronic device of FIG. 1, FIGS. 3-6 show steps in the manufacture of the electronic device of FIG. 1.

For example, as illustrated in FIGS. 1 and 2, the first layer 9 and the second layer 10 have contours which coincide. The longitudinal limbs 9a and 10a of the first layer 9 and of the second layer 10 have the same width. The protruding portions 15 and 16 result from the fact that the transverse limbs 9b of the first layer 9 are wider than the transverse limbs 10b of the second layer 10. The intermediate limbs 9c and 10c of the first layer 9 and of the second layer 10 have the same width and are on top of one another, forming the intermediate partition 6.

The electronic device 1 comprises optical electronic integrated circuit (IC) chips 17 and 18, which are located in the cavities 7 and 8, respectively, and are mounted on top of the solid back layer 3 by way of layers of adhesive 19 and 20 interposed between the front face of the solid back layer 3 and the back faces of the IC chips 17 and 18. The IC chips 17 and 18 include integrated optical elements 21 and 22 oriented towards or facing the front faces of these IC chips 17 and 18.

For example, the optical element 21 of the IC chip 17 is a light emitter and the optical element 22 of the IC chip 18 is a light receiver.

The electronic device 1 comprises electrical connections 23 and 24 which connect the IC chips 17 and 18 to back electrical contacts 25 and 26 of the back face of the solid back layer 3 of the carrier and confinement substrate 2, passing through the solid back layer 3 and the first layer 9 of the front frame 4.

The back electrical contacts 25 and 26 are configured to be connected to pads of a network of electrical connections of a receiving substrate on top of which the electronic device 1 is mounted, this receiving substrate bearing electronic components that are able to exchange electrical signals with the IC chips 17 and 18 by way of the network of electrical connections of the receiving substrate and the electrical connections 23 and 24.

The electrical connections 23 and 24 comprise electrical connection vias 27 and 28, which pass through the solid back layer 3 and which, in the cavities 7 and 8, have electrical contacts which are connected to back electrical contacts of the IC chips 17 and 18 by way of the electrically conductive layers of adhesive 19 and 20.

The electrical connections 23 and 24 comprise electrical connection vias 29 and 30, which pass through the solid back layer 3, and electrical connection vias 31 and 32, which pass through the protruding portions 15 and 16 of the first layer 9 of the frame 4.

The electrical connection vias 29 and 30 and the electrical connection vias 31 and 32 are in alignment with one another and are connected to one another at the joining (i.e., mounting or attachment) surface between the back layer 3 and the first layer 9. The electrical connections 23 and 24 comprise electrical wires which, in the cavities 7 and 8, connect the front ends of the electrical connection vias 31 and 32 to front electrical contacts of the IC chips 17 and 18.

Optionally, the carrier and confinement substrate 2 may include a network of electrical connections allowing the IC chips 17 and 18 to be electrically linked to one another and to back electrical contacts of the solid back layer 3.

The electronic device 1 comprises transparent dielectric encapsulation blocks 35 and 36, which are molded in the cavities 7 and 8 and in which the IC chips 17 and 18 and the electrical wires 33 and 34 are embedded.

The transparent encapsulation blocks 35 and 36 are, for example, made of an epoxy resin.

Advantageously, the front faces 35a and 36a of the transparent encapsulation blocks 35 and 36 are located in the same plane as the front face 10a of the second layer 10.

The electronic device 1 may be manufactured individually or in accordance with a mode of collective manufacture which will now be described.

As illustrated in FIG. 3, provision is made of a collective back layer 3A, a collective first layer 9A and a collective second layer 10A, which are stacked in such a way that sites E corresponding to electronic devices 1 to be manufactured coincide. The sites E are advantageously adjacent and are laid out in lines and columns.

At each site E, the collective back layer 3A is provided with the electrical connection vias 27, 28, 29 and 30, the collective first layer 9A is provided with the electrical connection vias 31 and 32 and has the openings 11 and 12, and the collective second layer 10A has the openings 13 and 14.

The layers 3A, 9A and 10A are press-laminated onto one another such that they adhere to one another and form a unit and such that electrical links are set up between the electrical connection vias 29, 31 and 30, 32 at the joining surface between the layers 3A and 9A.

A collective carrier and confinement substrate 2A provided with electrical connections is then obtained.

After this, as illustrated in FIG. 4, the IC chips 17 and 18 are mounted and fixed in the cavities 7 and 8 of each site E and on top of the collective back layer 3A by way of the conductive layers of adhesive 19 and 20, which set up electrical links between the electrical connection vias 27 and 28 and the IC chips 17 and 18.

After this, as illustrated in FIG. 5, at each site E, the electrical wires 33 and 34 are put in place between the IC chips 17 and 18 and the front ends of the electrical connection vias 31 and 32 which are located on the step portion of the front surface of the layer 9A which is not covered by layer 10A.

After this, as illustrated in FIG. 6, at each site E, the cavities 7 and 8 are filled with a pourable material, for example a resin. This operation can be performed in a suitable mold, optionally with the interposition of a film in order to avoid resin flashes.

After this, the material is set, for example by curing, so as to form transparent encapsulation blocks 35 and 36 molded in the cavities 7 and 8.

After this, a complete cutting operation 37 is performed through the collective carrier and confinement substrate 2A along the lines and columns of the separations between the sites E.

A plurality of electronic devices singulated at the locations of the sites E are thus obtained, each one corresponding to an electronic device 1 described with reference to FIG. 1.

According to one variant embodiment, the constituent material of the encapsulation blocks 35 and 36 includes specific particles that are able to form a light filter, in particular for infrared radiation.

Figure 7:
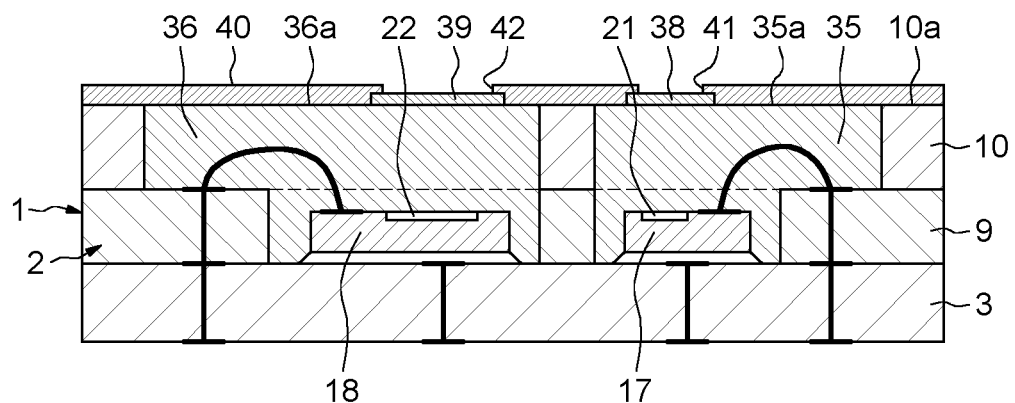
FIG. 7 shows a cross section of a variant embodiment of the electronic device of FIG. 1.

According to another variant embodiment illustrated in FIG. 7, the electronic device 1 further comprises optical dies 38 and 39, which allow the light to pass through, form, for example, light filters, in particular infrared radiation filters, and are located on top of the front faces 35a and 36a of the encapsulation blocks 35 and 36, facing (i.e., in vertical alignment with) the optical elements 21 and 22 of the IC chips 17 and 18.

For example, the optical dies 38 and 39 are made of a filtering resin.

The electronic device 1 further comprises an opaque front layer 40, which covers the front faces 35a and 36a of the encapsulation blocks 35 and 36 and the front face 10a of the second layer 10. The front layer 40 has openings 41 and 42 facing the optical elements 21 and 22 of the IC chips 17 and 18. The opaque front layer 40 may be made of an epoxy resin. The opaque front layer 40 may be produced in situ or may be an added film.

The front layer 40 includes openings 41 and 42 which coincide with the location of the optical dies 38 and 39.

The optical dies 38 and 39 and the front layer 40 are put in place based upon, and after, the collective device described with reference to FIG. 6.

According to one manufacturing variant, the optical dies 38 and 39 are fixed on top of the front faces 35a and 36a of the encapsulation blocks 35 and 36 at each site E. Then, an opaque collective front layer is produced, while forming the openings 41 and 42. This operation can be performed by sputtering. This collective front layer can be formed by a collective film which is provided with the openings 41 and 42 and connected, for example, by lamination. After this, the cutting operation 37 described above is performed, through the collective opaque front layer as well.

According to another manufacturing variant, provision is made of a collective opaque front layer provided with optical dies 38 and 39 at sites E. This collective front layer is placed on top of the collective second layer 10A and of the encapsulation blocks 35 and 36 of the collective device described with reference to FIG. 6, and this collective layer is connected, for example, by lamination. After this, the cutting operation 37 described above is performed, through the collective opaque front layer as well.

Figure 8:
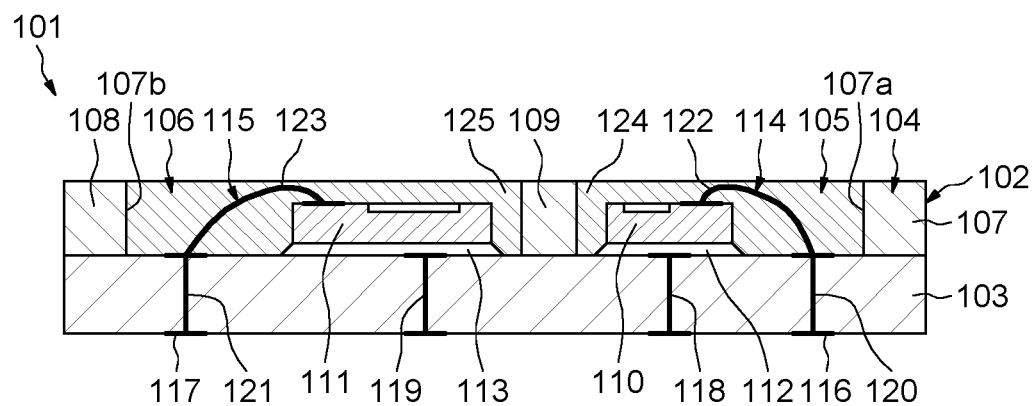
FIG. 8 shows a cross section of an electronic device including optical electronic IC chips.

According to a variant embodiment illustrated in FIG. 8, an electronic device 101 comprises, in the same way as the electronic device 1, an opaque dielectric carrier and confinement substrate 102, which is laminated and comprises a solid back layer 103 and a front frame 104 so as to delimit two cavities 105 and 106 on top of the solid back layer 3.

In this case, the front frame 104 comprises a layer 107, which has openings 107a and 107b so as to form a peripheral wall 108 and an intermediate partition 109, which joins two opposite limbs of the peripheral wall 108, the cavities 105 and 106 being formed on either side of this intermediate partition.

Optical electronic IC chips 110 and 111 are arranged in the cavities 105 and 106 and are fixed on top of the back layer 103 by way of layers of adhesive 112 and 113.

Electrical connections 114 and 115 connect the IC chips 110 and 111 to back electrical contacts 116 and 117.

The electrical connections 114 and 115 comprise electrical connection vias 118 and 119, which are equivalent to the electrical connection vias 27 and 28 of the electronic device 1, pass through the back layer 103 and are connected to the IC chips 110 and 111 by way of the conductive layers of adhesive 112 and 113.

The electrical connections 114 and 115 comprise electrical connection vias 120 and 121, which are equivalent to the electrical connection vias 29 and 30 of the electronic device 1 and pass through the back layer 103. In this case, electrical wires 122 and 123 connect the ends of the electrical connection vias 120 and 121 to front electrical contacts of the IC chips 110 and 111 in the cavities 105 and 106.

The IC chips 110 and 111 and the electrical wires 122 and 123 are embedded in transparent encapsulation blocks 124 and 125, which are molded in the cavities 105 and 106 and are equivalent to the transparent encapsulation blocks 35 and 36 of the electronic device 1.

The electronic device 101 is manufactured in the same way as the electronic device 1.

The dielectric carrier and confinement substrate 102 is manufactured by laminating the back layer 103, which is provided with the electrical connection vias 118, 119, 120 and 121, and the layer 107 forming the frame 104.

Then, the IC chips 110 and 111 are fixed in the cavities 105 and 106 on top of the back layer 103.

Then, the electrical wires 122 and 123 are put in place.

Then, the cavities 105 and 106 are filled so as to form the encapsulation blocks 124 and 125.

The constituent material of the encapsulation blocks 124 and 125 may include particles so as to filter light.

The electronic device 101 may be provided, on top of the encapsulation blocks 124 and 125, with optical dies that form light filters, facing the optical elements of the IC chips, and with an opaque front layer on top of the encapsulation blocks 124 and 125 and the layer 107, said optical dies and front layer being equivalent to the optical dies 38 and 39 and front layer 40 described above with reference to FIG. 7.

The invention claimed is:

1. An electronic device, comprising:
an opaque dielectric carrier and confinement substrate including a stack of layers laminated on top of one another, wherein said stack comprises a solid back layer and a front frame including a peripheral wall and an intermediate partition so as to delimit two cavities positioned over the solid back layer and on either side of the intermediate partition;
an electronic integrated circuit (IC) chip positioned inside each cavity of said two cavities and mounted on top of the solid back layer, wherein each electronic IC chip includes an integrated optical element;
electrical connections between each electronic IC chip and back electrical contacts of the solid back layer; and
transparent encapsulation blocks that are molded in the two cavities and which embed the electronic IC chips;
wherein the front frame comprises a first layer above the solid back layer and a second layer above the first layer, the first layer having portions protruding into the two cavities in relation to the second layer; and
wherein the electrical connections include electrical contacts arranged above said portions of the first layer.

2. The device according to claim 1, wherein each transparent encapsulation block has an upper surface which is coplanar with an upper surface of the front frame.

3. The device according to claim 1, wherein the electrical contacts are in the two cavities on a surface of the front frame.

4. The device according to claim 1, wherein the front frame comprises at least one layer which is laminated on top of the solid back layer and provided with openings forming the two cavities.

5. The device according to claim 1, wherein the transparent encapsulation blocks are made of a material which includes light-filtering particles.

6. The device according to claim 1, wherein the integrated optical element for one of the two electronic IC chips is a light emitter, and wherein the integrated optical element for another of the two electronic IC chips is a light receiver.

7. The device according to claim 1, wherein the electrical connections further include vias passing through the solid back layer.

8. The device according to claim 1, wherein the electrical connections comprise electrical contacts above the solid back layer.

9. The device according to claim 1, wherein the front frame comprises at least one layer above the solid back layer which includes openings providing said two cavities.

10. The device according to claim 1, wherein the electrical connections comprise vias of electrical connection crossing the protruding portions of the first layer.

11. The device according to claim 1, wherein the encapsulation blocks include light filtering particles.

12. The device according to claim 1, further comprising optical light filtering elements above the encapsulation blocks and an opaque front layer above the front frame, said opaque front layer including openings at the locations of the optical light filtering elements.

13. An electronic device, comprising:
an opaque dielectric carrier and confinement substrate including a stack of layers laminated on top of one another, wherein said stack comprises a solid back layer and a front frame including a peripheral wall and an intermediate partition so as to delimit two cavities positioned over the solid back layer and on either side of the intermediate partition;
an electronic integrated circuit (IC) chip positioned inside each cavity of said two cavities and mounted on top of the solid back layer, wherein each electronic IC chip includes an integrated optical element;
electrical connections between each electronic IC chip and back electrical contacts of the solid back layer;
transparent encapsulation blocks that are molded in the two cavities and which embed the electronic IC chips;
wherein the electrical connections comprise electrical contacts in the two cavities on a surface of the front frame; and
wherein the electrical connections comprise electrical connection vias passing through the front frame from said electrical contacts.

14. The device according to claim 13, wherein the electrical connections further comprise bonding wires embedded in the transparent encapsulation blocks and electrically connecting the electronic IC chips to the electrical contacts.

15. The device according to claim 13, wherein the electrical connections comprise further electrical connection vias passing through the solid back layer and electrically connected to the electrical connection vias passing through the front frame.

16. The device according to claim 15, wherein the electrical connections further comprise further electrical contacts on top of the solid back layer which electrically connect the electrical connection vias passing through the front frame to the further electrical connection vias passing through the solid back layer.

17. The device according to claim 13, wherein the front frame comprises at least one layer which is laminated on top of the solid back layer and provided with openings forming the two cavities.

18. The device according to claim 13, wherein each transparent encapsulation block has an upper surface which is coplanar with an upper surface of the front frame.

19. The device according to claim 13, wherein the transparent encapsulation blocks are made of a material which includes light-filtering particles.

20. The device according to claim 13, wherein the integrated optical element for one of the two electronic IC chips is a light emitter, and wherein the integrated optical element for another of the two electronic IC chips is a light receiver.

21. An electronic device, comprising:
an opaque dielectric carrier and confinement substrate including a stack of layers laminated on top of one another, wherein said stack comprises a solid back layer and a front frame including a peripheral wall and an intermediate partition so as to delimit two cavities positioned over the solid back layer and on either side of the intermediate partition;
an electronic integrated circuit (IC) chip positioned inside each cavity of said two cavities and mounted on top of the solid back layer, wherein each electronic IC chip includes an integrated optical element;
electrical connections between each electronic IC chip and back electrical contacts of the solid back layer;
transparent encapsulation blocks that are molded in the two cavities and which embed the electronic IC chips;
wherein the front frame comprises a first layer which is laminated on top of the solid back layer and a second layer laminated on top of the first layer, wherein the first layer includes surface portions that protrude into the two cavities and are not covered by the second layer.

22. The device according to claim 21, wherein the electrical connections comprise electrical contacts in the two cavities on said surface portions of the first layer.

23. The device according to claim 22, wherein the electrical connections comprise electrical connection vias passing through the first layer from said electrical contacts.

24. The device according to claim 23, wherein the electrical connections further comprise bonding wires embedded in the transparent encapsulation blocks and electrically connecting the electronic IC chips to the electrical contacts.

25. The device according to claim 23, wherein the electrical connections comprise further electrical connection vias passing through the solid back layer and electrically connected to the electrical connection vias passing through the first layer.

26. The device according to claim 25, wherein the electrical connections further comprise further electrical contacts on top of the solid back layer which electrically connect the electrical connection vias passing through the first layer to the further electrical connection vias passing through the solid back layer.

27. The device according to claim 21, wherein the transparent encapsulation blocks are made of a material which includes light-filtering particles.

28. The device according to claim 21, wherein each transparent encapsulation block has an upper surface which is coplanar with an upper surface of the front frame.

29. The device according to claim 21, wherein the electrical connections comprise electrical contacts in the two cavities on a surface of the front frame.

30. The device according to claim 21, wherein the front frame comprises at least one layer which is laminated on top of the solid back layer and provided with openings forming the two cavities.

31. The device according to claim 21, wherein the integrated optical element for one of the two electronic IC chips is a light emitter, and wherein the integrated optical element for another of the two electronic IC chips is a light receiver.

32. An electronic device, comprising:
an opaque dielectric carrier and confinement substrate including a stack of layers laminated on top of one another, wherein said stack comprises a solid back layer and a front frame including a peripheral wall and an intermediate partition so as to delimit two cavities positioned over the solid back layer and on either side of the intermediate partition;

an electronic integrated circuit (IC) chip positioned inside each cavity of said two cavities and mounted on top of the solid back layer, wherein each electronic IC chip includes an integrated optical element;

electrical connections between each electronic IC chip and back electrical contacts of the solid back layer;

transparent encapsulation blocks that are molded in the two cavities and which embed the electronic IC chips; and a light-filtering optical die on a top surface of each transparent encapsulation block positioned facing the integrated optical element.

33. The device according to claim 32, further comprising an opaque front layer which extends on top of the front frame and the transparent encapsulation blocks and is provided with an opening at locations of each light-filtering optical die.

34. The device according to claim 32, wherein each transparent encapsulation block has an upper surface which is coplanar with an upper surface of the front frame, and wherein the light-filtering optical die is mounted to said coplanar upper surface of the transparent encapsulation block.

35. The device according to claim 32, wherein the integrated optical element for one of the two electronic IC chips is a light emitter, and wherein the integrated optical element for another of the two electronic IC chips is a light receiver.

36. The device according to claim 32, wherein each transparent encapsulation block has an upper surface which is coplanar with an upper surface of the front frame.

37. The device according to claim 32, wherein the electrical connections comprise electrical contacts in the two cavities on a surface of the front frame.

38. The device according to claim 32, wherein the front frame comprises at least one layer which is laminated on top of the solid back layer and provided with openings forming the two cavities.

39. The device according to claim 32, wherein the transparent encapsulation blocks are made of a material which includes light-filtering particles.

* * * * *